United States Patent [19]

Ohno et al.

[11] 4,278,897
[45] Jul. 14, 1981

[54] LARGE SCALE SEMICONDUCTOR INTEGRATED CIRCUIT DEVICE

[75] Inventors: Kenichi Ohno, Tokyo; Tohru Hosomizu, Yokohama; Kazumasa Nawata, Kawasaki, all of Japan

[73] Assignee: Fujitsu Limited, Tokyo, Japan

[21] Appl. No.: 974,147

[22] Filed: Dec. 28, 1978

[51] Int. Cl.³ .............................................. H01L 27/00
[52] U.S. Cl. .............................. 307/455; 307/DIG. 1; 357/40; 357/45
[58] Field of Search ................. 307/213, 303, DIG. 1; 357/45, 51, 68, 40, 71

[56] References Cited

U.S. PATENT DOCUMENTS 3,808,475  4/1974  Buelow et al. .................... 357/45
3,909,636  9/1975  Masaki et al. .................... 307/213

Primary Examiner—William D. Larkins
Attorney, Agent, or Firm—Staas & Halsey

[57] ABSTRACT

A large scale semiconductor integrated circuit device comprising plural transistors and resistors formed in one semiconductor substrate, and many emitter-coupled circuits formed by connecting the transistors and resistors with a double metallic layer on the substrate surface.

Moreover, between the groups and respective input-/output terminals, large scale transistors are provided for outputting the emitter-follower circuits. These groups containing the emitter coupled circuits are connected to the input/output terminals by the double metallic wiring layer.

10 Claims, 21 Drawing Figures

LARGE SCALE SEMICONDUCTOR INTEGRATED CIRCUIT DEVICE

BACKGROUND OF THE INVENTION

1. Field of the Invention

The present invention relates to a large scale semiconductor integrated circuit device, particularly to a large scale semiconductor integrated circuit device configuration with a high integration density, high speed of operation and low power consumption.

2. Description of the Prior Art

A continued advancement of electronic circuitry and electronic computer systems demands increased integration density and speed of operation of semiconductor integrated circuit devices.

As a means of realizing high integration density and high speed of operation a method for designing integrated circuits known as the master-slice technique is typically employed. The master-slice technique is described, for example, in the Feb. 20, 1976 issue of "Electronics," pages 136 to 139. Namely, individual unit circuit areas are located along the row and column directions at the surface of a semiconductor substrate, wiring channels (wiring tracks) are laid out between these unit circuit areas, the wiring between these unit circuit areas is generally formed within these wiring channels. According to this master-slice technique, an increase in the number of circuits provided within the unit circuit areas, and in the number of unit circuit areas formed in the semiconductor substrate, results in a semiconductor integrated circuit having higher integration density.

For example, U.S. Pat. No. 3,643,232 (issued Feb. 15, 1972) discloses that functional elements or cells (corresponding to the unit circuit areas) are defined with proper separation in the form of an array in the row and column directions on the surface of a semiconductor substrate, the wiring of each functional element or each cell being made by a first wiring layer and the wiring between the different cells being made by a second wiring layer. By such means, the operable cells formed with the first wiring layer may be interconnected by the second wiring layer, and a logic circuit having the desired logic function can thus be formed in the semiconductor substrate. According to such a prior art technique, a large scale integrated circuit having only operable circuits can be formed within a semiconductor substrate.

The basic approach of such a general master-slice technique is well known, but the configuration and means for realizing the currently demanded higher integration density and high speed of operation is not suggested by the prior art.

For example, the U.S. Pat. No. 3,808,475 (issued Apr. 30, 1974) discloses a large scale semiconductor integrated circuit device comprising 100 emitter coupled logic (ECL) circuits within a single semiconductor substrate which allows a signal transfer delay time of 2 ns or less. The large scale semiconductor integrated circuit device disclosed in this U.S. Patent involves basic logic circuits with emitter coupled logic (ECL). This circuit device has 25 macros (each corresponding to said unit circuit area, functional element or cell), where a total of four ECLs are included in each unit circuit area, the macros being arrayed with adequate separation gap in row and column directions on a single semiconductor substrate surface. The wiring between the macros, for connecting the power supply ($V_{EE}$) and for connecting the components within each macro, comprises a first wiring layer extending in the row direction while connection of the macros and the wiring for grounding ($V_{CC}$) is provided by the second wiring layer extending in the column direction. Larger transistors are arranged between the macros and the output terminal pads, for outputting the emitter-follower circuits. Moreover, the width of the ground ($V_{CC}$) wiring and the power supply ($V_{EE}$) wiring is adjusted to provide resistance ratios of between 3 to 1 and 4 to 1, to compensate (or track) for voltage change due to a macro's position and the temperature distribution in the semiconductor substrate.

With such a configuration for a large scale semiconductor integrated circuit device, some improvement has been realized in integration density and operating speed, the improvement being in many cases sufficient to provide the performance required of currently known electronic devices. But with this approach it will be difficult to satisfy the performance to be required for practical use in the future. Particularly, since macros are arrayed on a single semiconductor substrate with some interval in both row and column directions, any improvement in integration density is limited.

In addition, within the large scale semiconductor integrated circuit elements, one may provide macros comprising logic circuits terminating within the semiconductor integrated circuit device itself, and macros for forming logic circuits to be connected to external circuits outside of the semiconductor integrated circuit device. All the macros may be formed by using an impurity diffusion mask with a repeated pattern, as a result of which the size of the transistors and resistors of each macro, and the impurity concentration etc., are the same for all macros. Therefore, even for the macros for internal termination, which could be driven with lower electrical power, a considerable amount of power is consumed, an amount equal to that consumed by the macros for external circuit output, which are driven with large amounts of electrical power. All the macros in such a semiconductor integrated circuit device consume large amounts of electrical power, thus necessitating a large capacity power supply and a large size heat sink.

SUMMARY OF THE INVENTION

It is an object of this invention to offer a large scale semiconductor integrated circuit device which can generally provide very high performance.

It is another object of this invention to offer a large scale semiconductor integrated circuit device having higher integration density.

It is another object of this invention to offer a large scale semiconductor integrated circuit device which consumes less electrical power, while having a high integration density.

It is still a further object of this invention to offer a large scale semiconductor integrated circuit device which has a large driving capability for external circuits to be connected to the integrated circuit.

An additional object of this invention is to offer a large scale semiconductor integrated circuit device which comprises various logic circuits or control circuits.

Thus, the present invention offers a large scale semiconductor integrated circuit device comprising:

a semiconductor substrate having a planar surface;

plural transistors formed in accordance with a predetermined pattern on the semiconductor substrate and extending into the substrate;

plural resistors formed in accordance with a predetermined pattern on the semiconductor substrate and extending into the substrate;

metallic layers arranged on the semiconductor substrate and connected to the transistors and resistors to form various circuits;

macros comprising logic circuits arrayed on the flat surface of the semiconductor substrate;

input/output terminal pads arranged near the periphery of the macro array on the semiconductor substrate;

some of the macros comprising logic circuits which handle a large amount of electrical power and other macros comprising logic circuits which handle little electrical power, the macros which handle a large amount of electrical power being arranged at the edges of the macro array with the macros handling low electrical power being at least partially arranged within the inner portion of the array.

DESCRIPTION OF PREFERRED EMBODIMENTS

Figure 1:
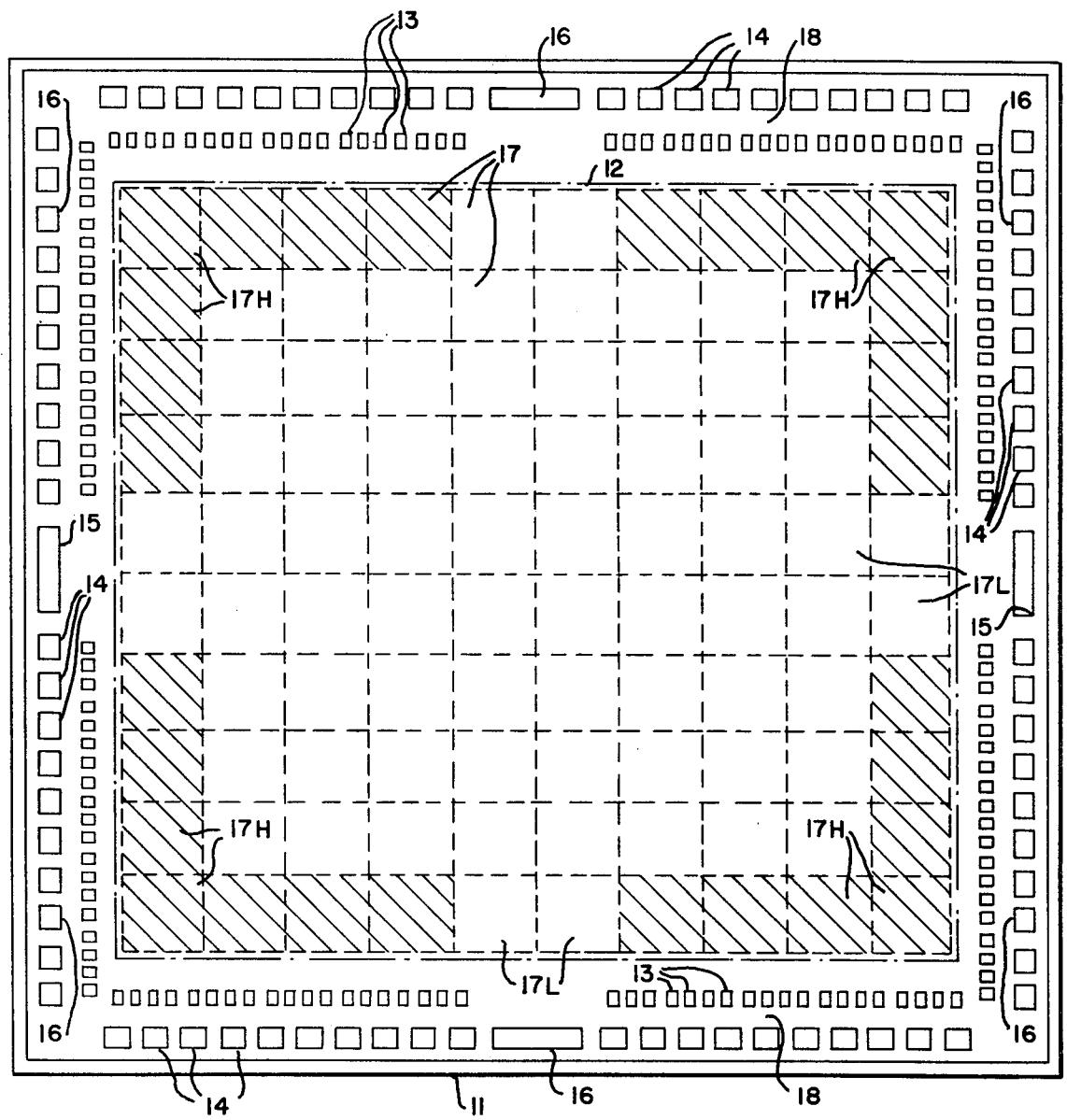
FIG. 1 is a plan view of a large scale semiconductor integrated circuit device according to the present invention.

The present invention is described in detail in reference to the drawings. FIG. 1 shows a silicon semiconductor substrate 11, the circuit area 12, (outlined by the broken line), large transistors for output 13, input/output terminal pads 14, power supply ($V_{EE}$) terminal pads 15 and ground ($V_{CC}$) terminal pads 16 arranged on a large scale semiconductor integrated circuit device (called an LSI chip hereinafter) of the present invention. The circuit area 12 is divided into 100 unit circuit areas 17 (each referred to as a macro hereinafter) aligned along respective row and column directions, as indicated by the dashed lines. The 28 macros 17H (shown with oblique lines) arranged at the positions near the four corners in the outermost rows and columns are the high power macros to be connected to an external circuit for output from the device, and the remaining 72 macros 17L are the low power macros which are terminated within the LSI chip. The detailed configuration of these macros is described further below.

Along the outside of the circuit area 12, 38 large output transistors per corner 13 are arranged in lines extending from each corner of said LSI chip along each side of the macro array. Outside the large output transistors 13, 20 terminal pads 16 per corner are arranged also extending from each corner of the LSI chip. Large pads 15, 16 are arranged near the center of each line of 21 terminal pads on each side of the circuit area 12 to form the power supply terminal pad 15 or the ground terminal pad 16. The power supply terminal pads 15 and the ground terminal pads 16 are symmetrically arranged as shown. Moreover, the third terminal pad from each corner along the terminal pad columns containing the power supply terminal pad 14 are also employed as ground terminal pads 16. The remaining 76 electrode pads are designated as the I/O pads 14. As will be described later, these macros 17, large transistors 13, power supply terminal pads 15, ground terminal pads 16, and I/O pads 14 are connected as required by means of a double layer of metallic wiring, so that the LSI ship can comprise as much as 400 gate circuits.

In addition, the wiring channels 18 are provided between the large transistors 13 and the terminal pads 14, 15 and 16 to allow for interconnection between the macros, for connecting the macros to the terminal pads and for connection between the large transistors. In this array, the high power macros 17H are not located immediately adjacent the power supply terminal pads 15 and the ground terminal pads 16. Rather, the high power macros 17H and the corresponding large transistors 13 and the input/output terminal pads 14 are arranged as closely as possible. Moreover, the number of outputs of the high power macros 17H corresponds to the number of large transistors 13 and input/output terminal pads 14, and particularly the number of high power macros 17H is defined by the number of input/output terminal pads 14.

In another embodiment of the present invention, when the positions of the power supply terminal pads and of the ground terminal pads are changed, a high power macro may be correspondingly shifted to a different location other than the four corners along the outside of the array of macros. In addition, it is also possible to alternately arrange the high power macros and the low power macros along the outside of the macro array.

Figure 2:
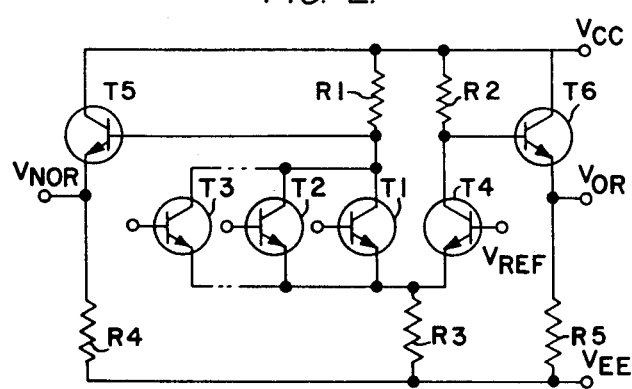
FIGS. 2 to 4 are schematic diagrams showing basic configurations of electronic circuits for the large scale semiconductor integrated circuit device of the present invention.
Figure 3:
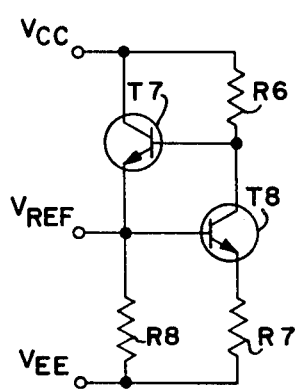
Figure 4:
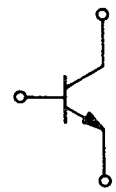

FIG. 2 to FIG. 4 show diagrams for basic circuits of the macros. FIG. 2 shows an emitter coupled logic circuit (current switch emitter-follower) which allows a maximum of three inputs, and which forms the basic logic circuit in the LSI chip of the present invention. The emitter coupled logic (ECL) comprises six NPN type transistors $T_1$ to $T_6$ and five resistors $R_1$ to $R_5$. Here, the transistors $T_1$ to $T_3$ are input transistors for the ECL and the transistor $T_4$ is a reference transistor. The emitters of the input transistors $T_1$ to $T_3$ and $T_4$ are connected in common. Transistors $T_1$ to $T_3$ form a current switch. The transistor $T_5$ is an output transistor which is connected to the collector of the input transistors to form an emitter-follower output circuit together with the resistor $R_4$, making possible the extraction of a NOR output. The transistor $T_6$ is also an output transistor which is connected to the collector of the reference transistor $T_4$ and forms an emitter-follower output circuit together with the resistor $R_5$, making possible the extraction of an OR output. The resistor $R_1$ is a load resistor for the input transistors, while the resistor $R_2$ is a load resistor for the reference transistor $T_4$. Moreover, the resistor $R_3$ is a current bias resistor for the current switch. As embodiments of the present invention, up to four or more of these emitter coupled logic circuits may be arranged in one macro.

FIG. 3 shows a bias driver circuit for the emitter coupled logic circuit. This bias driver circuit comprises two NPN type transistors $T_7$, $T_8$ and three resistors $R_6$ to $R_8$. The output terminal $V_{REF}$ of the bias driver circuit is connected to the base of the reference transistor $T_4$ of the emitter coupled logic. One of these bias driver circuits is provided in each macro comprising such ECL circuits, and each bias driver generally drives all the ECL circuits in common.

FIG. 4 shows a large transistor forming an emitter follower circuit for output for external connection, which is generally arranged as described above between the macros and the input/output terminal pads of the LSI ship. The transistors and resistors for the above-mentioned circuits are all arranged within each respective macro. Although not illustrated in the circuit diagram, the termination resistors $R_4$ and $R_5$ may have alternate resistor patterns to achieve the desired options in resistance values. These alternate configurations allow selection as desired to connect two resistors in parallel or to use only a single individual resistor. Also a current bias resistor $R_3$ may be given two or three resistor patterns also to allow greater flexibility for connecting those resistors as desired in parallel or individually, so that the emitter voltage and the current of the transistors forming a current switch can be adjusted.

Figure 5:
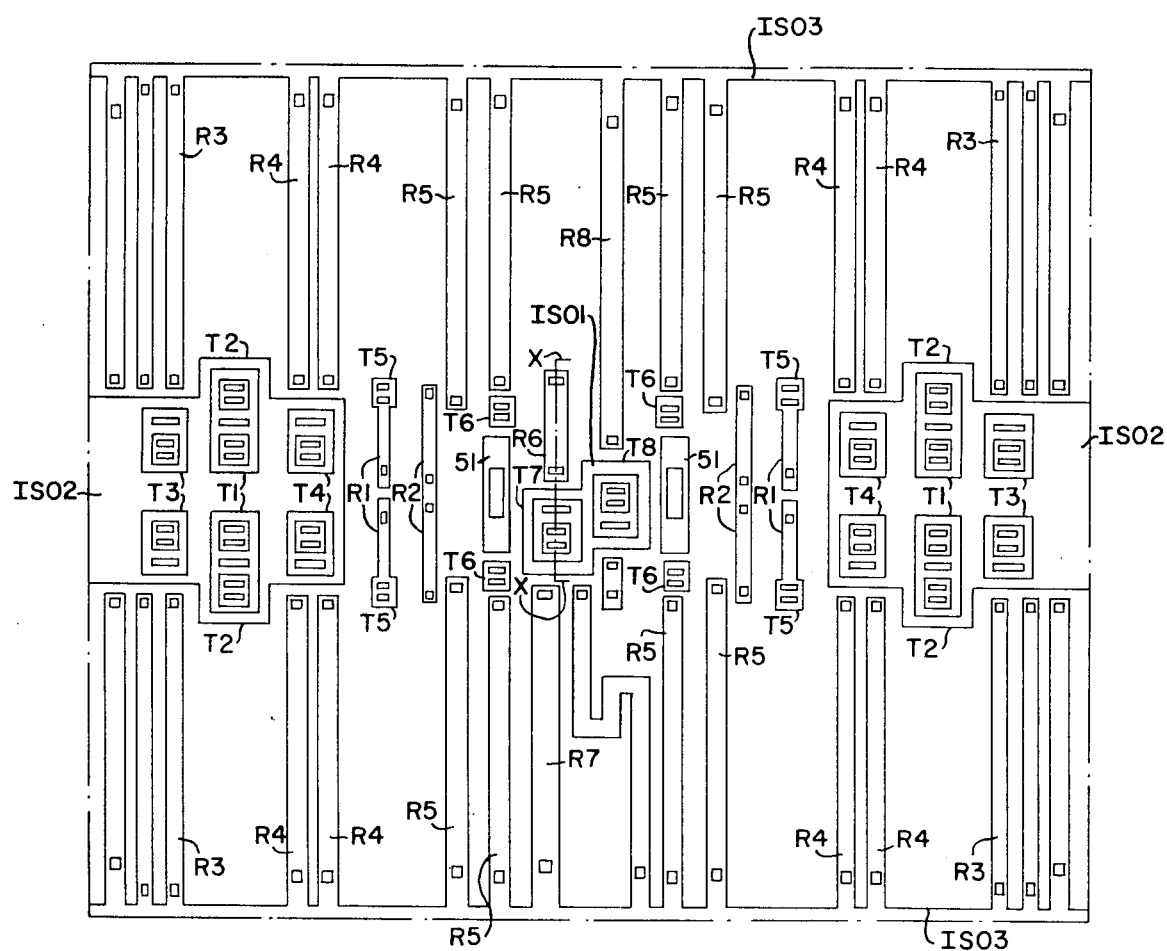
FIG. 5 is a plan view indicating the diffusion pattern for low power macros in a large scale semiconductor integrated circuit device according to the present invention.
Figure 6:
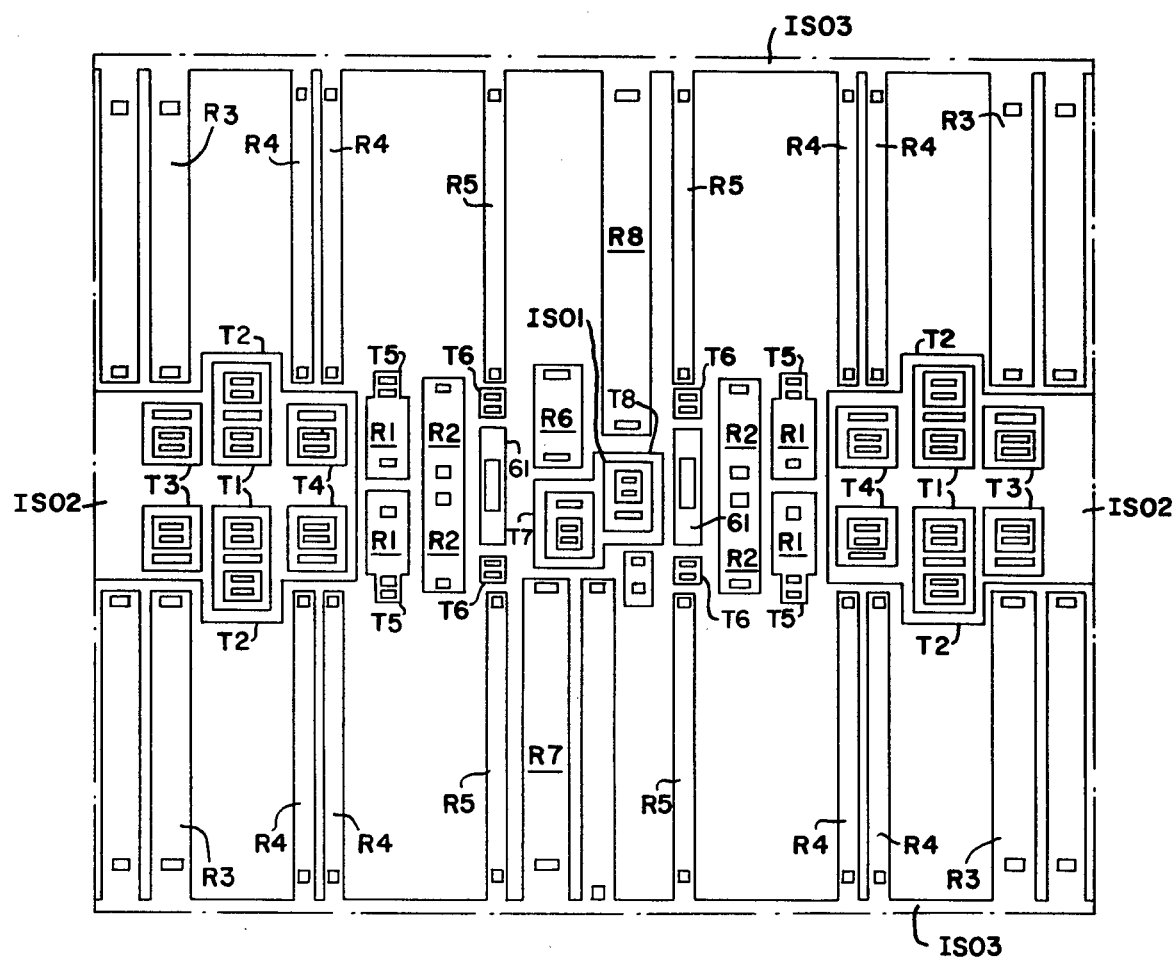
FIG. 6 is a plan view indicating the diffusion pattern for high power macros in a large scale semiconductor integrated circuit device according to the present invention.

FIG. 5 and FIG. 6 show the diffusion patterns for one macro comprising the four ECL circuits, the bias driver circuit, and spare termination resistors and current bias alternate resistors. FIG. 5 shows the diffusion pattern and the associated electrode window patterns of a low power macro (17L in FIG. 1), that is for a circuit terminated within the LSI chip. The reference numerals of the transistor resistor patterns are the same as in the circuit diagrams of FIG. 2 to FIG. 4.

FIG. 5 shows the transistors $T_7$ and $T_8$ of the bias driver circuit, resistors $R_6$ to $R_8$ arranged in the center area of the macro, and four pairs of transistors $T_1$ to $T_6$ and resistors $R_1$ to $R_5$ respectively provided in almost symmetrical pattern at both sides of the bias driver circuit to form two emitter coupled logics. The resistors are formed from a P type region within the N type substrate having a rectangular band shaped pattern or they are formed with a fold-back pattern as shown for $R_7$ when a high resistance value is necessary. Electrode windows are indicated by the rectangular marks (□) within the diffusion pattern. In the figure, the emitter diffusion areas generally coincide with the emitter electrode windows.

The transistors $T_7$ and $T_8$ are mutually insulated from each other and from the N type region in which the resistors are formed by the P type isolation region $I_{SO\,1}$. The transistors $T_1$ to $T_4$ are also insulated from each other and from the N type region in which the resistors are formed by the P type isolation region $I_{SO\,2}$. Here, transistors $T_1$ and $T_2$ have a common collector configuration, while transistors $T_3$ and $T_4$ are mutually independent. As for transistor $T_5$, the collector is directly grounded and the base is of the P type, while the load resistor $R_1$ connected to the base is also P type. Therefore, the base region and load resistor $R_1$ are formed in the N type region in which resistors are formed, with the same continuous diffusion pattern.

The transistor $T_6$ is also directly grounded at its collector as is the case of said transistor $T_5$, the collector thus being formed within the N type region wherein the resistors are formed. For this reason, an N+ type region 51 is formed in the N type region in order to apply the ground voltage to the N type region comprising the collectors of transistors $T_5$ and $T_6$. The resistor $R_2$ comprises a common and continuous resistor pattern in the two adjacent ECL circuit elements symmetrically disposed above and below each other. A pair of electrode windows are symmetrically and separately arranged near the center of the $R_2$ resistor pattern. Therefore, the two electrode windows can be connected in common, or only one single electrode window can be selected for connection.

Dual resistor patterns are provided for each of the termination resistors $R_4$ and $R_5$, for parallel connection or for individual use as required. Three resistor patterns are provided for the current bias resistor $R_3$ of the current switch, so that any combination of these patterns can be connected. Thus, the emitter voltage and the current of the transistors forming the current switch can be controlled.

Since the resistors $R_3$, $R_4$, $R_5$, $R_7$ and $R_8$ are connected in common to the power supply, they are connected to the P type isolation region $I_{SO\,3}$. This isolation region $I_{SO\,3}$, as will be explained later, is maintained at the same potential as the isolation regions $I_{SO\,1}$ and $I_{SO\,2}$ by means of the P type semiconductor substrate. Although not illustrated, the isolation regions $I_{SO\,2}$ are symmetrically extended into the laterally adjacent macros, that is in the left and right directions in FIG. 5, thus accommodating transistors $T_1$ to $T_4$ in these adjacent macros. In the same way, although not illustrated, the isolation region $I_{SO\,3}$ is extended both to the laterally adjacent macros and also to the adjacent macros above and below the macro of FIG. 5.

As a modification of the above embodiment, it is also possible not to insulate transistor $T_7$ from the resistors by means of the isolation region $I_{SO\,1}$, but as in the case of the transistors $T_5$ and $T_6$, the collector region may be directly grounded. Thus the N+ type region 51 would be used as the collector terminal for transistor $T_7$ as well.

FIG. 6 shows the diffusion pattern and the associated electrode window pattern of a high power macro (17H in FIG. 1) for connection to a circuit external of the LSI chip where the identification of the transistor and resistor patterns again correspond to that of the circuit elements shown in FIG. 2 to FIG. 4. As is clear from FIG. 6, the transistors $T_7$, $T_8$ and resistors $R_6$ to $R_8$ which form the bias driver circuit are arranged in the center region of the macro. Four pairs of the transistors $T_1$ to $T_6$ and resistors $R_1$ to $R_5$ are arranged symmetrically on both sides of the bias driver circuit elements, thus forming two ECL circuits.

The resistors are again formed with the long rectangular band-shaped patterns and comprise P type regions. Electrode windows are located near both ends of these resistors, as shown by the rectangular symbols. Moreover, the width of these rectangular resistor patterns in the high power macros may be wider than in the low power macros, and the associated resistance values are therefore lower, so that a larger current can be applied to the resistors. The transistors $T_7$ and $T_8$ are again insulated from each other and from the N type region in which the resistors are formed by means of the P type isolation region $I_{SO1}$. The transistors $T_1$ to $T_4$ are mutually insulated from each other and from the N type region in which the resistors are formed, by means of the P type isolation region $I_{SO2}$. Here, transistors $T_1$ and $T_2$ have a common collector configuration while transistors $T_3$ and $T_4$ are mutually independent. The transistor $T_5$ is formed in the N type region wherein the resistors are formed, with the diffusion pattern wherein the base region and the load resistor $R_1$ are in common, since the collector is directly grounded and the base and also the load resistor $R_1$ to be connected to the base are P type. The transistor $T_6$ is also directly grounded at its collector as in the case of said transistor $T_5$, the base and emitter are also formed in the N type region where the resistors are formed. The N+ type regions 61 are formed in the N type region in order to lead out the collector of transistors $T_5$ and $T_6$ and to apply the ground voltage to the N type region where the resistors are formed.

It is a characteristic of this configuration that the transistor in the high power macros are made larger than in the low power macro, and particularly that the emitter region area is also made wider, so that a larger current can be applied. Thus, the transistor with such a configuration can handle considerably higher power. The resistor $R_2$ has a continuous resistor pattern common to the two adjacent ECL circuit elements arranged above and below each other, as shown in FIG. 6. The resistor patterns are again provided with a mutually separated pair of electrode windows near the center area. Thereby, these two electrode windows may be connected in common, or any of the electrode windows may be selected. In addition, as for the termination resistor $R_4$, a pair of parallel resistor patterns are provided, and these may be connected in parallel or a single desired one may be selected.

For the current bias resistor $R_3$ of the current switch, two wide resistor patterns are provided as shown, and these two resistor patterns may be used in parallel or a single one may be selected, as required. Thereby the emitter voltage and the emitter current of the transistors forming a current switch can be set. Since the resistors $R_3$, $R_4$, $R_5$, $R_7$ and $R_8$ are connected in common to the power supply, the resistor patterns are connected to the P type isolation region $I_{SO3}$, and thus one end of each resistor is kept at the power supply voltage. The isolation region $I_{SO3}$ is, as will be described, kept at the same voltage as that of said isolation regions $I_{SO1}$, $I_{SO2}$ by means of the P type semiconductor substrate.

Although not illustrated, the isolation region $I_{SO2}$ extends symmetrically to the laterally adjacent macros, thus accommodating transistors $T_1$ to $T_4$ in the adjacent macros. The isolation region $I_{SO3}$, as described in connection with FIG. 5, also extends into the laterally adjacent macros and as well is formed in common with corresponding circuit elements in the vertically adjacent macros.

As another modification of the above embodiment, it is also possible that the transistor $T_7$ be not insulated from resistors by means of the isolation region $I_{SO1}$, in which case the collector would be directly grounded in the vicinity of the base of $T_7$, as in the case of transistors $T_5$ and $T_6$. Thus, the N+ type region 61 could be used as the collector lead-out terminal.

In the above macro configuration, the resistors $R_3$ and $R_7$ may have the values shown in the Table 1, as an example of standard values respectively in the low and high power macros.

TABLE 1

|  | Low power macro (ohm) | High power macro (ohm) |
| --- | --- | --- |
| $R_3$ | 3600 | 950 |
| $R_7$ | 3090 | 1650 |

Wiring may be arranged along the row direction for connecting between macros, or between macros and I/O pads, and may comprise a first wiring layer in the region in which resistors $R_3$, $R_4$, $R_5$, $R_7$ and $R_8$ are formed.

The wiring arranged along the column direction for connecting between macros, or between macros and I/O pads, may be formed mainly by a second wiring layer in the region of the macros between the ground wiring and power supply wiring. Thus, the emitter follower output from the high power macro shown in FIG. 6, for example, may be connected to the peripheral area of the LSI by the first wiring layer for input to a large scale emitter follower transistor and hence to an output terminal pad.

Figure 7:
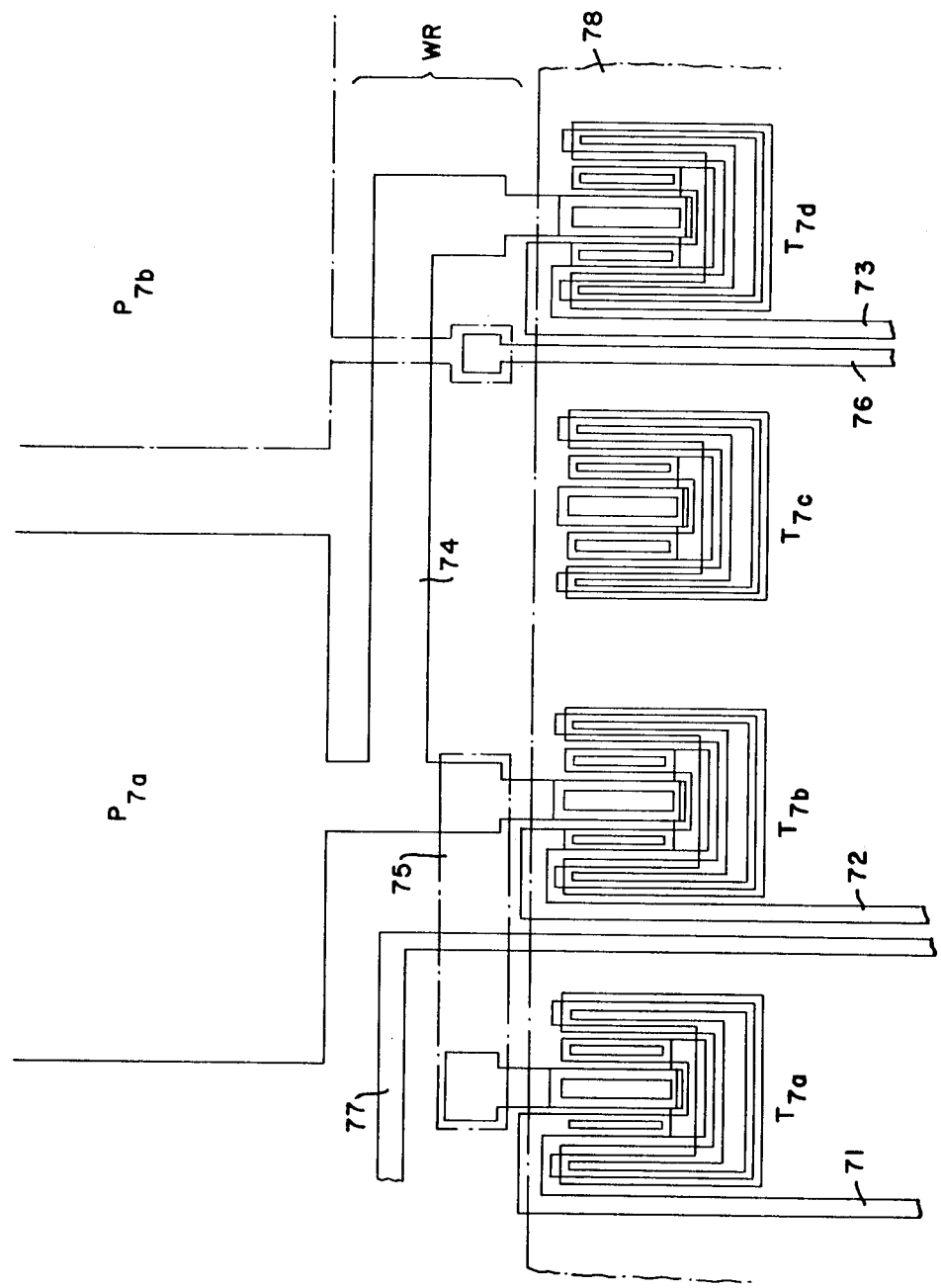
FIG. 7 is a plan view showing wiring from the macros connected to the output terminal pad via large transistors for output from the large scale semiconductor integrated circuit device of the present invention.

FIG. 7 shows a practical example of the connection between such a large scale emitter follower transistor and an output terminal pad. In the embodiment shown in FIG. 7, the output of the emitter follower circuit, extending from the collectors (not shown) of the transistors $T_1$ to $T_3$ or transistor $T_4$ forming the current switch in the high power macro, is connected to the bases of the large scale emitter follower transistors $T_{7a}$, $T_{7b}$ and $T_{7d}$, respectively via the wirings 71, 72 and 73. The emitters of the transistors $T_{7a}$, $T_{7b}$, $T_{7d}$ are mutually connected as desired in the wiring channel WR provided between the transistors and the terminal pads by means of the first wiring layer 74 and the second wiring layer 75 (shown with dotted lines) formed in the wiring channel WR. This first wiring layer is extended to form the terminal pad $P_{7a}$.

A wiring 76 led out from the macros connects to the second wiring layer in the wiring channel, where it crosses over with the first wiring layer, the first layer connecting the emitters of the large scale emitter follower transistors. The second wiring layer is extended to form the terminal pad $P_{7b}$. The wiring channel WR also contains the wiring for mutual connection between macros, in addition to the wirings for mutual connection of the emitters of the large scale emitter follower transistors and the wiring for the terminal pads. The wiring for the collectors of the transistors $T_{7a}$ to $T_{7d}$ and ground 78 are connected via the windows provided on the collector regions of the transistors. Termination resistors (not shown) may be connected to the emitters of the large transistors for output and the logical outputs from the emitter follower circuits shown in FIG. 7. These may be inserted and connected in an area near a terminated part of an output line extending from the large transistor in an external circuit (not illustrated) of the LSI chip.

In the above explanation, a basic ECL circuit is formed within each of many macros. However, the configuration of the logic circuit in the macros of the LSI chip of the present invention is not limited only to the basic circuit example above. In order to satisfy any required logic functions, multiple input gate, wired OR or flip-flop etc., the logic circuits to be formed in the different macros are determined as required. Moreover, the wirings of the 100 macros in the LSI chip is also determined to satisfy the logic functions required for each LSI chip. In addition, from the view point of the master-slice technique, there is no limitation that an LSI chip must be formed by making full use of all 100 macros.

Figure 8A:
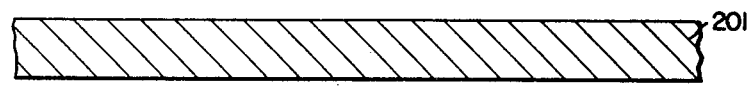
FIGS. 8a through 8n are cross-sections showing the manufacturing process for a large scale semiconductor integrated circuit device of the present invention.

The LSI chip of the present invention may be produced by the following manufacturing process. The bipolar integrated circuit configuration has a generally planar configuration. Such a manufacturing process is explained by referring to FIGS. 8a to 8n. The process shown in these figures produces a device with a configuration of one transistor and one resistor, as shown, for example, in the cross section X-X' in FIG. 5.

a silicon semiconductor substrate 201 having a planar surface and a diameter, for example, of 76.2 mm is prepared as shown in FIG. 8a. The silicon semiconductor substrate has a P type conductivity with a specific resistance of 5 to 20 ohm-cm, for example.

Figure 8B:
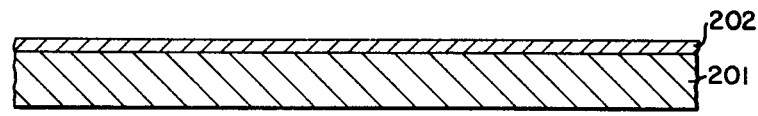
Figure 8C:
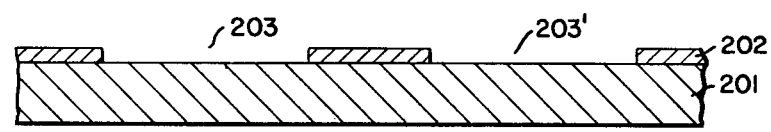

Then, as shown in FIG. 8b, an insulation film 202 is formed covering the surface of the semiconductor substrate 201 in thickness, for example, of 4000 Å. This insulation film 202 may comprise silicon dioxide ($SiO_2$). This silicon dioxide film can be formed, for example, by direct oxidation of the surface of the semiconductor substrate 201 for 30 minutes at a temperature of 1100° C. in a wet oxidizing atmosphere. Then, as shown in FIG. 8c, apertures or windows 203, 203' for injecting impurities are formed on the insulation film. As a means for providing an aperture to said insulation film, a well known photo-etching method may be applied. Moreover, it is also possible to utilize plasma etching with a halogen gas of $CF_4$.

Figure 8D:
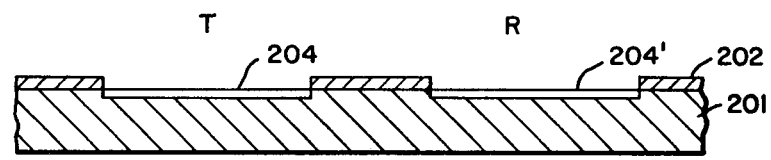

It is a characteristic of the present invention that the windows are formed not only in the area T where a transistor is to be formed, but also in the area R where a resistor is to be formed. Subsequently, as shown in FIG. 8d, a proper donor type impurity is selectively injected into the exposed surface of the semiconductor substrate 201 to form the N+ type regions 204 and 204'. Antimony (Sb), phosphorous (P) or arsenic (As) are well known donor type impurities that can be used, and these may be introduced by the well known diffusion method, thus forming the N+ type regions 204, 204' with a depth of 3 to 10 microns. As the diffusion method, a gas phase diffusion or a solid-solid phase diffusion method etc., can be used as desired.

Figure 8E:
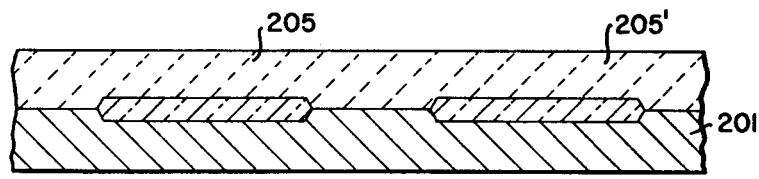
Figure 8F:
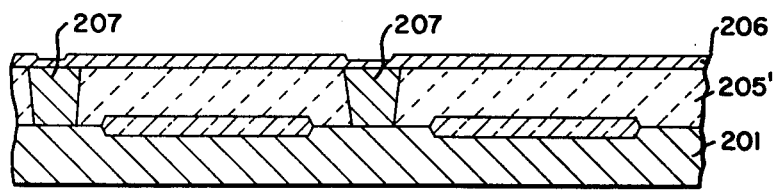

Then, the insulation film 202 is removed and, as shown in FIG. 8e, an N type epitaxial layer 205, 205' having a low impurity concentration is formed on the surface of the exposed semiconductor substrate. The epitaxial growth can be realized by a well known method, for example, a gas phase reaction of the hydride of the donor impurity with silicon tetrachloride ($SiCl_4$). The N type epitaxial layer 205, 205' is formed with a thickness of 2 to 3 microns. At this time, the donor impurities diffuse out from the N+ type regions 204, 204' and are partially diffused into the substrate 201 and the epitaxial layer 205, 205', to form N+ type buried layers. Then, as shown in FIG. 8f, an insulating film 206 is formed covering the surface of the N type epitaxial layer with a thickness of 4000 Å, for example, followed by forming a window in the insulating film 206 at desired positions through such a window. The P type isolation region 207 is formed by selectively diffusing an adequate acceptor impurity, for example, boron (B) is well known. The gas phase diffusion method, or the solid-solid phase diffusion method mentioned above can also be used.

Figure 8G:
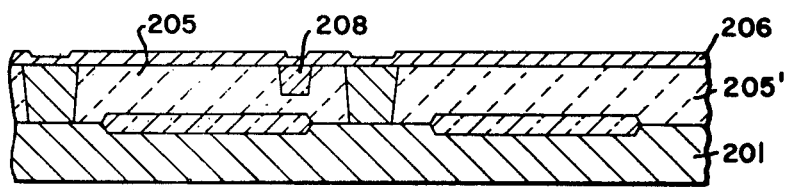
Figure 8H:
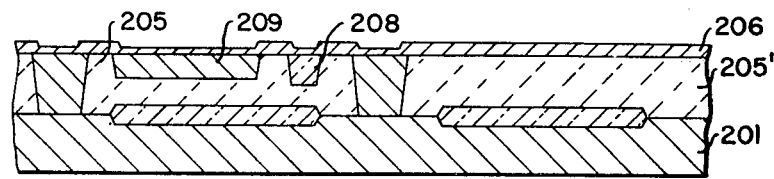

Then, as shown in FIG. 8g, a window is formed at a desired position of the insulating film 206 covering the N type epitaxial layer 205, for example, at the position on one land 205 of the N type epitaxial layer and then a donor impurity is selectively diffused, to form the N+ type collector contact area 208 with a thickness of 1.5 to 2.5 microns. Subsequently, as shown in FIG. 8h, a window is again formed in the desired position of the insulating film 206 covering the surface of the one land 205 of the N type epitaxial layer and the acceptor impurity is selectively injected, thus forming the P type base region 209 with a thickness of, for example, 0.3 to 1 micron.

Figure 8I:
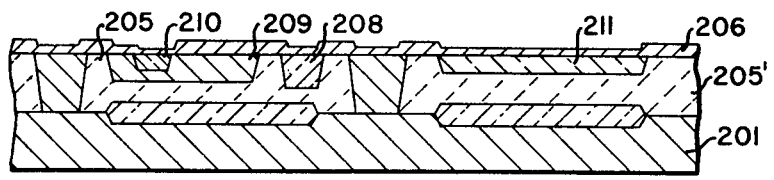
Figure 8J:
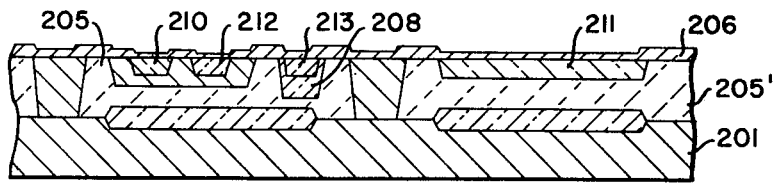

In the next step, as shown in FIG. 8i, windows are respectively formed over the base region 209 in the insulating film 206 covering the surface of the one land 205 of the N type epitaxial layer and over on the desired position of the insulation film 206 covering the surface of the other land 205' of N type epitaxial layer, and then the acceptor impurity is selectively injected again, thus forming the P type base contact region 210 in said base region 209, and the P type resistance region 211, respectively. These P type regions 210 and 211 are formed with a thickness, for example, of 0.2 to 0.8 microns. Then, as shown in FIG. 8j, windows are formed again over the base region 209 in the insulating film 206 covering the surface of the one land 205 of the N type epitaxial layer, and over the N type collector contact region 208 adjacent to said base region 209, and then a donor impurity is injected selectively again to form the N+ type emitter region 212 in said base region 209 and the N+ type region 213 in said collector contact region 208. These N+ type regions 212 and 213 are formed with a thickness of 0.2 to 0.8 microns, for example. For the injection of impurities into the semiconductor substrate or epitaxial layer, a well known ion injection method may be applied instead of the above-mentioned diffusion method. When the depth for impurity injection, namely the depth of the specified conductivity type region to be formed, is shallow, then an ion injection method is particularly effective.

When an impurity is injected into a semiconductor substrate or an epitaxial layer, many apertures or windows for impurity injection may be provided in an insulating film formed on the surface of the epitaxial layer. Because of this impurity injection, the surface of the insulating film can become very rough, with many jogs and dents. Such a rough surface of the insulation film makes difficult the precise formation of the metallic wiring layer formed subsequently in the injection process, and can cause a discontinuity in the metallic wiring layer. Thus, in the case of the present invention, in the process shown in said FIG. 8i, for example, the acceptor impurity may be deposited on the surface of the P type base region 209 through a window formed in the insulating film on the surface of the land 205 of N type epitaxial layer. Thereafter, the insulating film is removed by etching and then thermal processing is carried out in an oxidizing atmosphere. As a result, the base contact region 210 is formed in the P type base region 209 and the resistor region 211 is formed in the land 205' of the N type epitaxial layer. Simultaneously, an insulating film of silicon dioxide with uniform thickness is formed on the surface of the epitaxial layer. Therefore, only the windows for forming the emitter region and the collector contact region by ion injection remain, and thereby flatness of the insulation film is maintained.

Figure 8K:
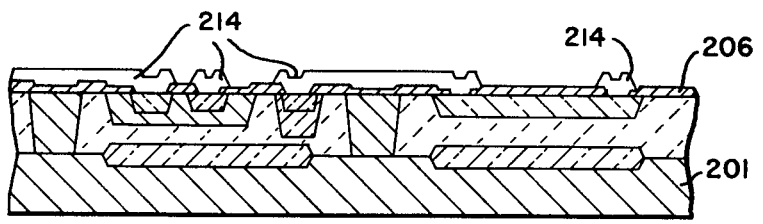
Figure 8L:
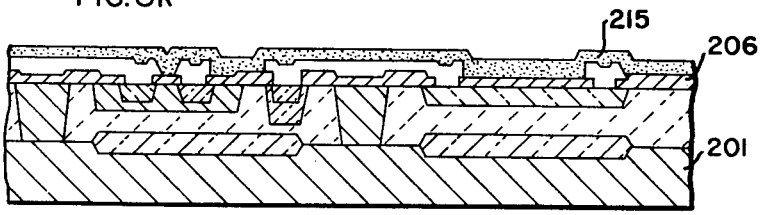

Then, as shown in FIG. 8k, the windows for providing the collector base and emitter electrodes, and the window for providing the resistor are formed in the insulation film 206 covering the epitaxial layer surface. Thereafter, a metallic film comprising, for example, aluminum (Al) is deposited in these windows and on the surface of the insulating film, and the metallic film is removed selectively in accordance with the desired wiring pattern, thus forming a first wiring layer 214. For deposition of aluminum, a vacuum evaporation method can be used, and for selective removal, a photo-etching or plasma etching method can be applied. The aluminum wiring layer is formed with a thickness of about 1 micron. Then as shown in FIG. 8l, an insulation layer 215 comprising phosphosilicate glass (PSG) is coated over the first wiring layer 214 and the exposed surface of the insulating film 206. This phosphosilicate glass can be formed by a chemical reaction from a gas phase of monosilane ($SiH_4$) and phosphine ($PH_3$) to a thickness of about 1 to 2 microns.

Figure 8M:
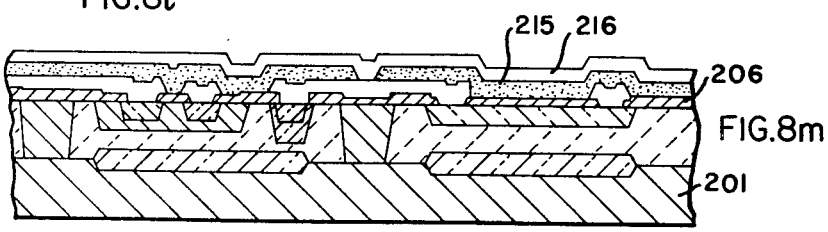
Figure 8N:
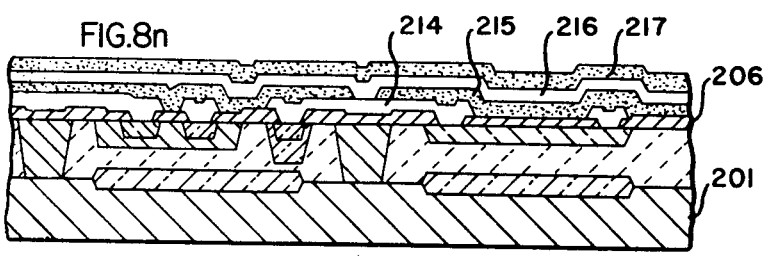

Then, as shown in FIG. 8m, an aperture or window is formed at the desired portion of the insulating film and then aluminum is coated again covering the insulating layer and windows, and then selectively removed to form the second wiring layer 216 on the insulating layer. For selective removal of the phosphosilicate glass layer, a photo-etching or plasma etching method may be used. Thereafter, as shown in FIG. 8n, a surface protection layer 217 comprising for instance phosphosilicate glass is formed again covering the second wiring layer 216 and the exposed surface of the insulating layer 215. This surface protection layer is formed to a thickness of 2 to 3 microns on almost the entire part of the LSI chip, except for the input/ourput pad surfaces.

The LSI chip of the present invention can be formed by this manufacturing process described above.

Since a large scale semiconductor integrated circuit device of the present invention comprising low power macros for internal circuits and high power macros for output to external circuits, power consumption is minimized with high integration density. Thusly, the ability to drive external circuits to be connected to the large scale semiconductor integrated circuit device is drastically improved.

We claim:

1. An LSI chip comprising:
a semiconductor substrate having a planar surface;
transistors and resistors formed with selected patterns in said surface;
metallic layers on said surface comprising means for selectively connecting said transistors and resistors;
input/output terminal pads disposed at the periphery of said LSI chip, said pads including terminal pads for supply and ground potentials for operating said LSI chip;
large transistors connected as emitter-follower circuits for outputting signals from internal logic circuits of said LSI chip, said large transistors being located near said input/output terminal pads;
macros arranged in an array on said surface, each said macro selectively comprising said transistors and resistors to form a respective unit logic circuit, each said unit logic circuit selectively handling high and low power, said macros comprising said unit logic circuits for handling high power being selectively terminated internally and externally of said LSI chip, said macros comprising said unit logic circuits for handling low power being terminated only within said LSI chip, said transistors and resistors of said macros comprising said unit logic circuit for handling high power having dimensions that are selectively larger than the corresponding dimensions of said transistors and resistors of said macros comprising said unit logic circuits for handling low power, said macros comprising said unit logic circuits for handling high power being located at the periphery of said macro array.

2. The LSI chip of claim 1 comprising said large transistors being located between said array of macros and said input/output terminal pads.

3. The LSI chip of claim 2 comprising wiring channels located between said input/output terminal pads and said large transistors.

4. The LSI chip of claim 1 or 2, selected ones of said unit logic circuits comprising current switches employing emitter coupled logic selectively formed from said transistors, resistors and metallic layers.

5. The LSI chip of claim 1, comprising at least a pair of selected ones of said resistors in selected ones of said macros being disposed for selective connection between a respective output of a respective one of said transistors of the same macro and a respective output of the macro, each said selected resistor having a different resistance value than the others of said selected resistors of said macro.

6. The LSI chip of claim 1, said metallic layers comprising a signal system for selectively connecting between said transistors and resistors within each of said macros, between different ones of said macros, and between said input/output pads and said macros, and said metallic layers also comprising systems for selectively distributing said supply and ground potentials to said macros.

7. The LSI chip of claim 6, said signal system comprising first and second wiring layers.

8. The LSI chip of claim 6, said macro array defining row and column directions, said supply potential distribution system comprising first wiring layers extending in a first one of said directions between adjacent macros of said array, second wiring layers extending between adjacent macros in the second of said directions and selectively connecting with said first wiring layers, and trunk wiring layers arranged at both ends of said first wiring layers and selectively connected to said supply potential terminal pads.

9. The LSI chip of claim 8, said ground potential distribution system comprising a portion of said second wiring layers and a trunk wiring layer located at both ends of said second wiring layer and selectively connected to said ground terminal pads, said second wiring layers being insulated from said first wiring layers.

10. The LSI chip of claim 6, said signal system selectively connecting said transistors and resistors in each of said macros comprising a first wiring layer.

* * * * *

UNITED STATES PATENT AND TRADEMARK OFFICE
CERTIFICATE OF CORRECTION

PATENT NO. : 4,278,897
DATED : 14 July 1981
INVENTOR(S) : KENICHI OHNO et al.

It is certified that error appears in the above—identified patent and that said Letters Patent is hereby corrected as shown below:

Col. 4, line 22, "ship" should be --chip--.
Col. 5, line 21, "ship" should be --chip--.

Col. 9, line 2, "view point" should be --viewpoint--;
      line 14, "a" should be --Å--;
      line 21, "A" should be --Å--;
      line 25, "C." should be --C--;
      line 61, "A" should be --Å--.
Col. 11, line 34, "ourput" should be --output--.

Signed and Sealed this

Twenty-third Day of March 1982

[SEAL]

Attest:

GERALD J. MOSSINGHOFF

Attesting Officer     Commissioner of Patents and Trademarks